US006601297B1

(12) United States Patent
Schmidt

(10) Patent No.: US 6,601,297 B1
(45) Date of Patent: Aug. 5, 2003

(54) METHOD FOR PRODUCING MICRO-OPENINGS

(75) Inventor: Walter Schmidt, Russikon (CH)

(73) Assignee: Dyconex Patente AG, Zug (CH)

( * ) Notice: Subject to any disclaimer, the term of this patent is extended or adjusted under 35 U.S.C. 154(b) by 0 days.

(21) Appl. No.: 09/763,782

(22) PCT Filed: Jan. 14, 1999

(86) PCT No.: PCT/CH99/00016
§ 371 (c)(1),
(2), (4) Date: Mar. 26, 2001

(87) PCT Pub. No.: WO00/13062
PCT Pub. Date: Mar. 9, 2000

(30) Foreign Application Priority Data

Aug. 28, 1998 (CH) .............................................. 1763/98

(51) Int. Cl.⁷ ................................................. H01K 3/10
(52) U.S. Cl. ........................................... 29/852; 83/691
(58) Field of Search ..................... 83/685, 687, 691; 76/4, 107.1; 29/852, 846

(56) References Cited

U.S. PATENT DOCUMENTS

| 5,178,051 A | 1/1993 | Smith et al. |
| 5,692,423 A | 12/1997 | Hachikawa et al. |
| 5,916,335 A | * 6/1999 | Gerhardt ..................... 76/107.1 |
| 6,005,198 A | 12/1999 | Gregoire |

FOREIGN PATENT DOCUMENTS

| DE | 4002326 A1 | 8/1990 |
| EP | 0490586 A1 | 6/1992 |

OTHER PUBLICATIONS

Patent Abstracts of Japan, Publication No.: 08083789, Publication Date: Mar. 26, 1996, Title: Micromachining Method.

"Method to Control the Geometry and Vertical Profile of Via Holes in Substrate Materials", IBM Technical Disclosure Bulletin, Bd. 35, Nr. 5, Oct. 1, 1992, pp. 211–216, XP000312938.

* cited by examiner

Primary Examiner—Gregory L. Huson
Assistant Examiner—Peter deVore
(74) Attorney, Agent, or Firm—Rankin, Hill, Porter & Clark LLP

(57) ABSTRACT

The invention concerns methods for the production of micro-holes in semi-finished components (300) for printed circuit boards (200), consisting of several layers of electrically conductive materials (21,22) and dielectric materials (20), wherein micro-holes are embossed into dielectric materials and/or electrically conductive materials and that the embossed micro-holes are subsequently cleaned by means of plasma or by means of wet-chemical processes

14 Claims, 10 Drawing Sheets

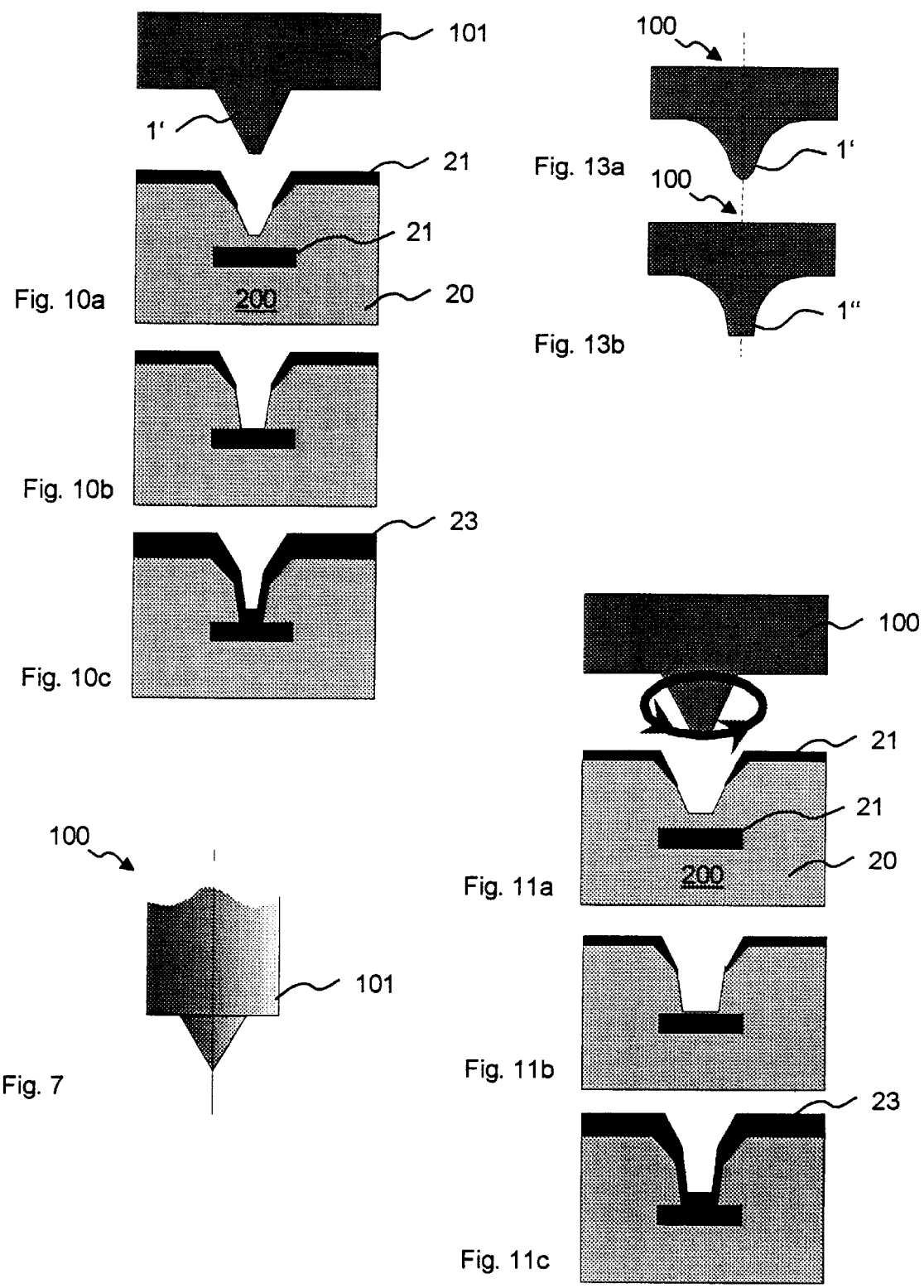

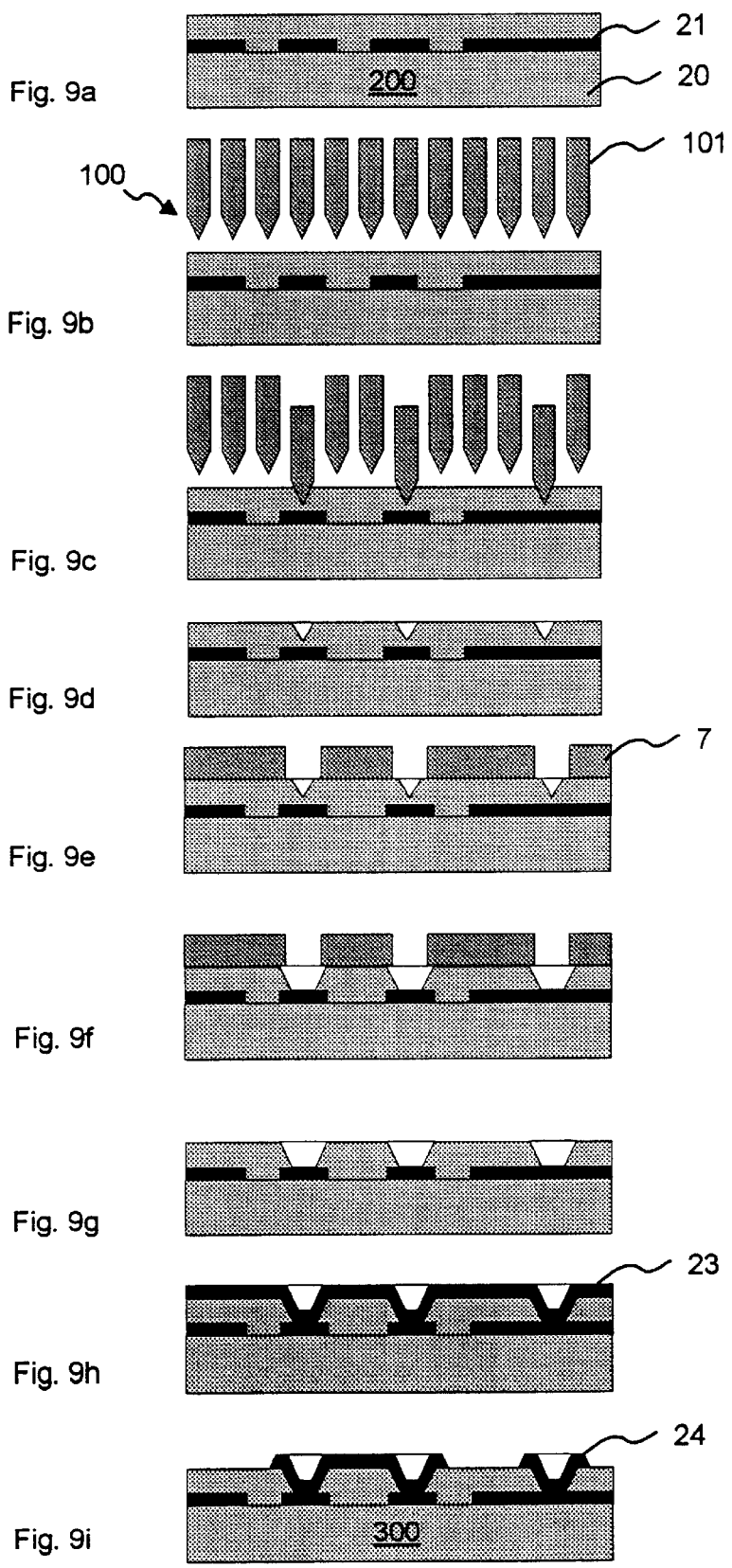

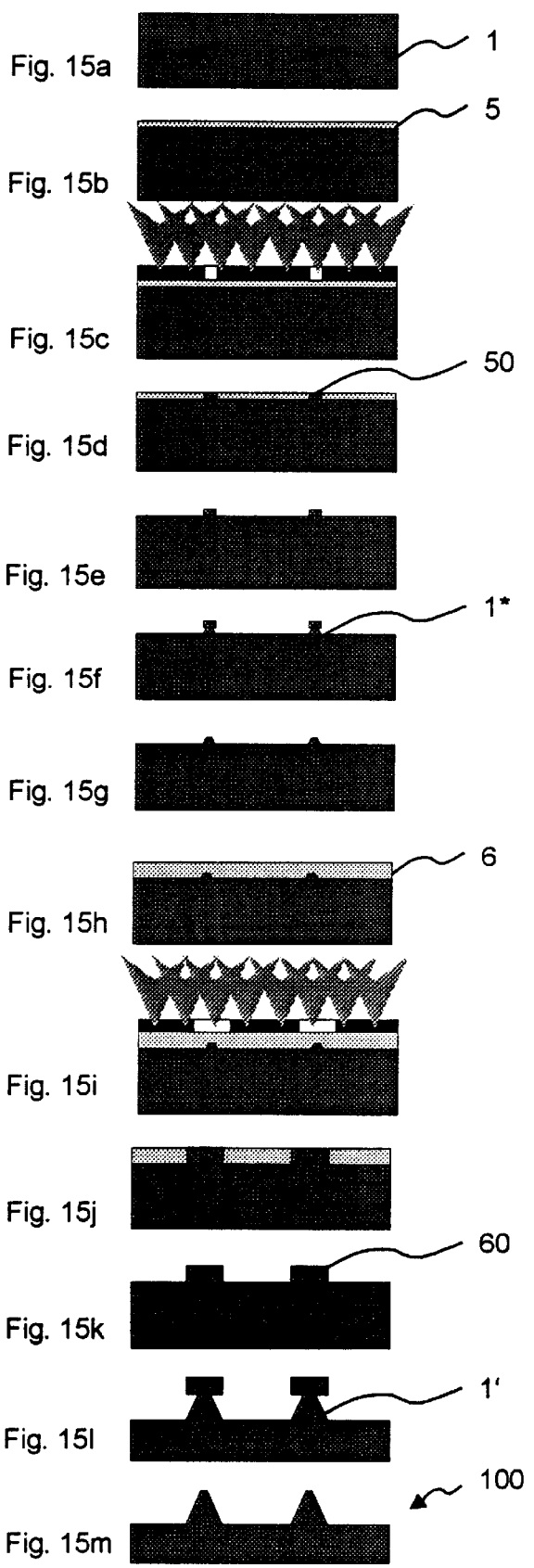

METHOD FOR PRODUCING MICRO-OPENINGS

BACKGROUND OF THE INVENTION

Field of the Invention

The present invention is generally directed toward the field of printed circuit board technology and, more particularly, toward a method for producing micro-holes in printed circuit boards.

In modern printed circuit board technology, increasingly micro-holes or micro-vias are being utilized, because the conventional mechanically drilled Z-axis connections take up too much space. There are a number of production methods for micro-holes in semi-finished components for printed circuit boards. Apart from plasma drilling, also laser drilling or photo-chemical structuring can be utilized for producing small holes in photosensitive dielectric materials.

While laser drilling is a sequential process, which in the case of large numbers of holes naturally also takes a long time, plasma drilling and also the method of photo-structured micro-holes are parallel processes, which enable all holes to be produced simultaneously.

Photo-chemical structuring manifests a number of disadvantages, in particular the impeccable application of liquid, photosensitive dielectric layers is very expensive and for this reason it is also very difficult to achieve a high production yield.

Plasma drilling is well known and, since 1991, has proved to be very successful. Nevertheless, there are some points, which are still worthy of improvement:

On the one hand, plasma drilling is a parallel process, i.e., all holes are produced simultaneously. The process lasts between 10 and 45 minutes, depending on the material and its thickness. The drilling speed can hardly be increased anymore for a given dielectric material and, particularly when a smaller number of holes are to be drilled, the method is not as economical as in the case of great hole densities. For this reason, it would be advantageous to increase the speed of plasma drilling still further so as to shorten the process time.

The plasma drilling process utilized is an isotropic etching process, which does not only act in the Z-direction of the semi-finished components, but also laterally, in the X-Y-direction. As a result of this, a so-called undercutting is produced, which in particular in the case of blind or pocket holes has to be eliminated by a further process, namely hole forming. In doing so, a layer of electrically conductive material is homogeneously removed and, simultaneously, overhanging edges of material is etched off. The disadvantages of this process are, on the one hand, the additional costs, and, on the other hand, an enlargement of the etched holes. It would be advantageous to prevent this undesirable undercutting.

Prior to the actual plasma drilling, in a photo-process all those points are made free of any conductive material, at which a hole is to be etched. This photo-structuring process cannot be carried out without any loss in yield. In particular, small dust particles can lead to the consequence that undesirable additional openings are produced in the electrically conductive material, which in the plasma also become holes, and which subsequently in the electric through-plating can lead to electric short-circuits.

SUMMARY OF THE INVENTION

The present invention presented is directed toward a method for the production of micro-holes that avoids or eliminates the disadvantages in the art described above. The inventive method is inexpensive, easy to apply and compatible with customary techniques of the printed circuit board industry.

In accordance with the present invention, a combination of an embossing process with subsequent cleaning of the holes is utilized. Embossing dies and embossing devices of this type are cheap to manufacture with conventional methods and are used for the production of apertures in the dielectric material. They can, however, also be utilized for the removal of local areas of electrically conductive material. In a secondary treatment, the embossed micro-holes are cleaned and subsequently electrically contacted through with the conventional processes of printed circuit board technology. Embossing of micro-holes according to the present invention results in a significant shortening of the process times and enables novel, very advantageous possibilities.

BRIEF DESCRIPTION OF THE DRAWINGS

These and further features of the present invention will be apparent with reference to the following description and drawings, wherein:

FIG. 13b illustrates a disadvantageous embossing die, FIGS. 14a–14c schematically illustrate a part of a further exemplary semi-finished printed circuit board component with a stamped fault, manufactured with the use of a disadvantageous embossing tool in accordance with FIG. 13b, FIGS. 15a–15m schematically illustrate a part of a further exemplary embossing die, manufactured with a further advantageous manufacturing process.

DETAILED DESCRIPTION OF THE PREFERRED EMBODIMENTS

Up to now, no embossing has been utilized in the manufacture of printed circuit boards. A first reason for this is the fact that, up until now, only through holes were made, for which, however, no embossing is necessary. A further reason is the fact that, for embossing, an embossing die or embossing stamp is required and die plates of this kind can only be manufactured at high cost, for example, by means of spark erosion. Because of these considerations, the specialist, up until now, has not taken the embossing of semi-finished printed circuit board components into consideration.

At the present time, in printed circuit board technology more and more blind or pocket holes are being set up. This is the case because, for example, the dielectric layers utilized have become very thin. It has furthermore emerged that embossing dies and embossing devices can be manufactured relatively easily and cheaply with known means and possibilities of printed circuit board production.

Figure 1A:
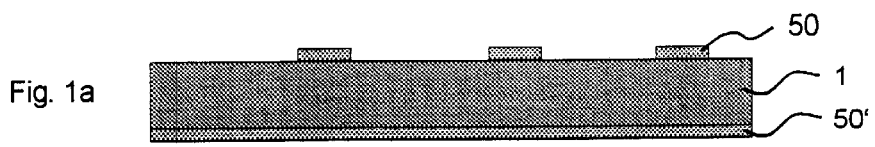
FIGS. 1a–1c schematically illustrate a part of an exemplary embossing die, manufactured by an advantageous manufacturing process, FIGS. 2a–2f schematically illustrates a part of a first exemplary semi-finished printed circuit board component, manufactured with the use of an embossing die in accordance with FIG. 1c, FIGS. 3a–3e schematically illustrate a part of a further exemplary semi-finished printed circuit board component, manufactured with the use of an embossing die in accordance with FIG. 1c, FIGS. 4a–4f schematically illustrate a part of a further exemplary embossing die, manufactured with an advantageous manufacturing process, FIGS. 5a–5e schematically illustrate a part of a further exemplary semi-finished printed circuit board component, manufactured with the use of an embossing die in accordance with FIG. 4f, FIGS. 6a–6e schematically illustrate a part of a further exemplary semi-finished printed circuit board component, manufactured with the use of an embossing die in accordance with FIG. 4f, FIG. 7 schematically illustrates a part of an exemplary embossing device, manufactured with an advantageous manufacturing process, FIGS. 8a–8g schematically illustrate a part of a further exemplary semi-finished printed circuit board component, manufactured with the use of an embossing device in accordance with FIG. 7, FIGS. 9a–9i schematically illustrate a part of a further exemplary semi-finished printed circuit board component, manufactured with the use of an embossing device in accordance with FIG. 7, FIGS. 10a–10c schematically illustrate a part of a further exemplary semi-finished printed circuit board component, manufactured with the use of an embossing die or of an embossing device, FIGS. 11a–11c schematically illustrate a part of a further exemplary semi-finished printed circuit board component, manufactured with the use of an embossing die or of an embossing device, FIGS. 12a–12b schematically illustrate a part of a further exemplary semi-finished printed circuit board component, manufactured with the use of an embossing die or of an embossing device as well as with the use of an elastic intermediate layer, FIGS. 13a–13b schematically illustrate parts of two embossing dies, a further exemplary embossing die in accordance with FIG. 13a is manufactured with a further advantageous manufacturing process.
Figure 1B:
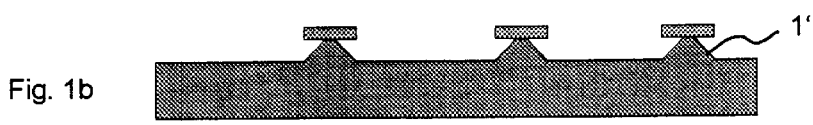
Figure 1C:

FIGS. 1a–1c schematically illustrate a part of an exemplary embossing die 100, manufactured with a first advantageous manufacturing method. Serving as source material is a metal plate 1, for example, a piece of sheet metal. This plate is photo-chemically, for example, by means of exposed photosensitive resist 50,50' processed such that a cone-shaped bump (perforation tip) 1' is etched out at all points at which a micro-hole is to be produced in printed circuit boards. As a result of the undercutting in the wet-chemical process, the bumps, the height of which lies in the range of 25 to 100 μm, are automatically formed with a cone shape. With the knowledge of the invention presented here, of course also other source materials, for example, non-metallic plates and foils, can be utilized.

This first advantageous embossing die produced in this manner can be tested 100% and serves as a reusable tool in the manufacturing of semi-finished components for printed circuit boards. In particular it serves as a tool for producing blind or pocket holes in semi-finished printed circuit board components. The cone shaped form of the bumps makes possible a simple pulling out or separation of the embossing die from the semi-finished printed circuit board component. For example, no damage to the semi-finished printed circuit board component, or contamination thereof with dirt, takes place. This simple separation of the embossing die from the semi-finished printed circuit board component increases the process yield because secondary processes, such as through contacting of the blind or pocket holes, can be carried out under optimum conditions.

During the manufacture of semi-finished printed circuit boards, advantageously semi-finished printed circuit board components are utilized. Such components consist of several layers of electrically conductive material, which are separated by layers of dielectric material. The semi-finished product can be a more or less prefabricated semi-finished printed circuit board component already having conductor tracks structured in layers of electrically conductive material. In this context it is to be observed that the dielectric material between layers of electrically conductive material to be connected does not have any fibre-glass reinforcement, preferably, is pure resin. This resin, in most instances epoxy resin or polyimide resin, respectively, mixtures of various plastic materials, can, but does not have to be, completely cured.

FIGS. 2a–2f illustrate a first exemplary manufacturing method for semi-finished printed circuit boards. In a positioning process in accordance with FIG. 2a, an embossing die 100 manufactured by the exemplary production process in accordance with FIGS. 1a–1c is positioned opposite a prefabricated part 200 for semi-finished printed circuit board components such that the elevation of the points 1' of the embossing die coincide, with respect to position, with prestructured openings in a copper surface 21 of the outside of the printed circuit board. This positional alignment to pre-structured openings in the electrically conductive material surface is optional and not a condition, as will be shown by means of other examples.

Figure 2A:
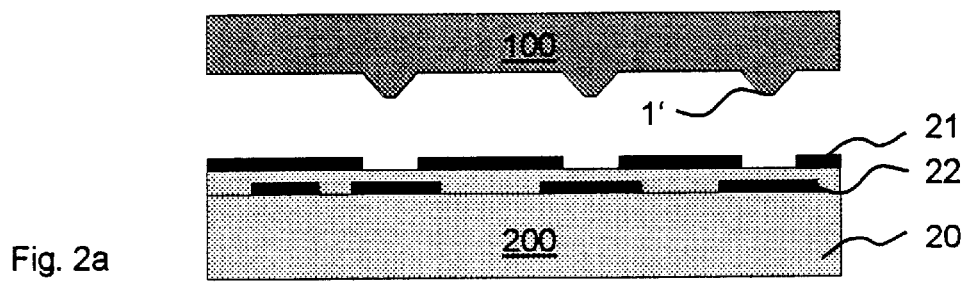
Figure 2B:
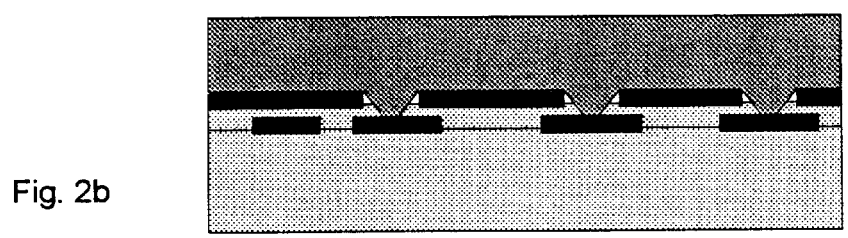
Figure 2C:
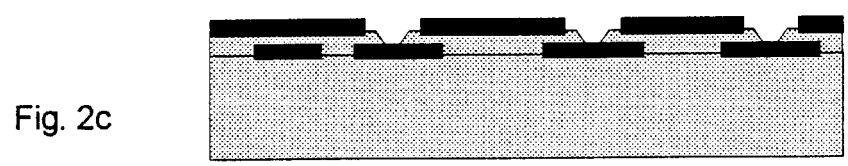
Figure 2D:
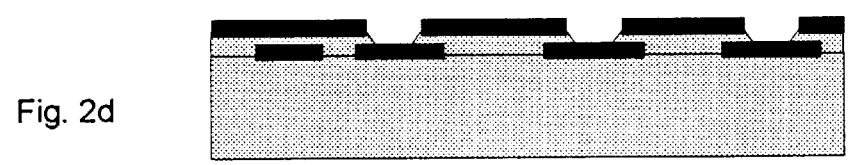

In an embossing process in accordance with the FIGS. 2b and 2c, the die plate is now pressed against the prefabricated part, as a result of which the points are pressed into the prefabricated copper openings and locally displace the resin of the dielectric material 20. In doing so, it may possibly make sense to heat up the die plate, in order to make the resin to be displaced semi-pasty.

Through embossing alone, the resin at the bottom of the indentations is not completely displaced. This makes a thorough subsequent cleaning of the holes necessary. This can be implemented with plasma in accordance with FIG. 2d, wherein in contrast to the normal plasma drilling only little material has to be removed, which significantly shortens the processing time. In addition, it is also possible to utilize wet-chemical processes, such as, e.g., the use of strongly oxidizing media (potassium permanganate solutions), such as are utilized for cleaning the holes in the conventional printed circuit board manufacture.

Figure 2E:
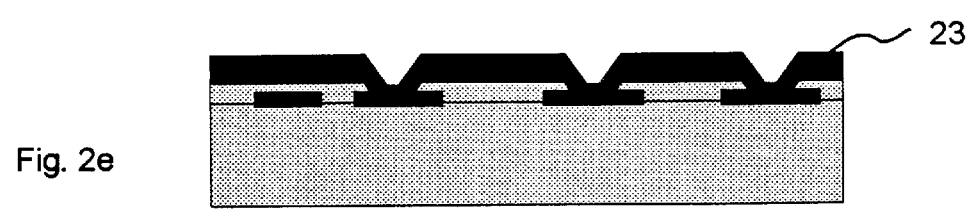
Figure 2F:
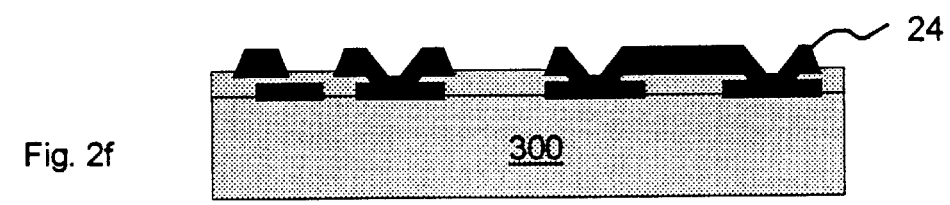

In accordance with FIG. 2e, thereupon the produced semi-finished printed circuit board 300, exactly like conventionally manufactured ones, can be coated with electrically conductive material 23, such as, for example, copper and contacted through to the next electrically conductive layer of material 22. Subsequently in accordance with FIG. 2f the photo-chemical structuring of the conductor tracks 24, etc., takes place.

As a result of the strongly shortened processing time in the plasma, practically no undercutting, or else only a small, absolutely tolerable undercutting, is produced. Accordingly, the outer layer, for example, does not anymore have to be thinned to etch off any possible overhangs. This is a further advantage, which also has an effect on the costs. In addition, one can produce much smaller holes in this manner.

A further advantage lies in the fact that only those holes that have been pre-punched by the embossing die are etched through to the next electrically conductive layer of material. This is because, for example, the plasma cleaning is not sufficient to create a through hole at a possibly present superfluous hole in the copper layer. As a result of this, the problem mentioned above of the undesirable, additional holes is solved.

Figure 3A:
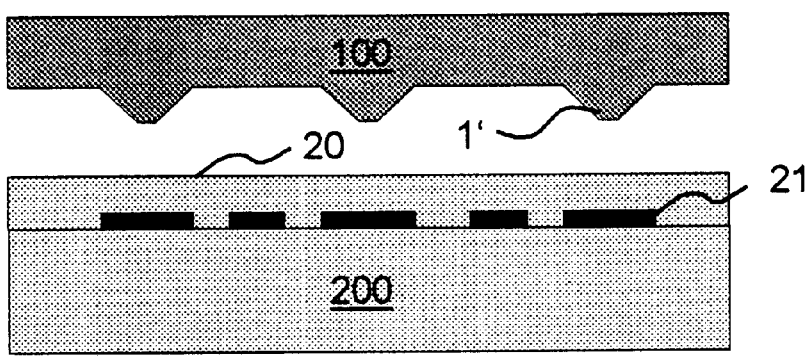
Figure 3B:
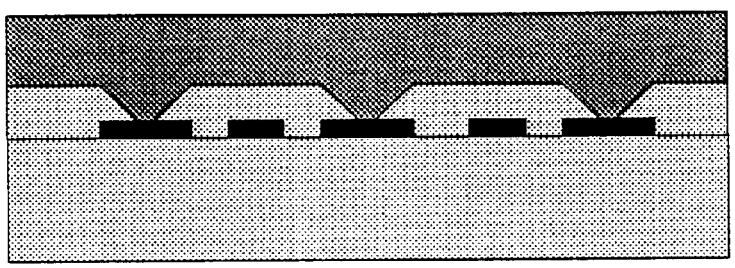
Figure 3C:
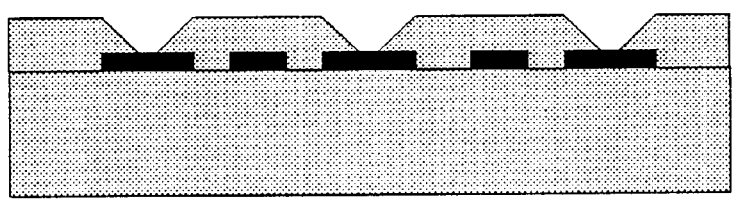
Figure 3D:
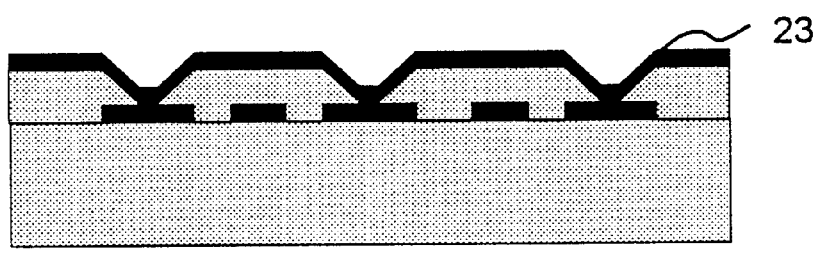
Figure 3E:
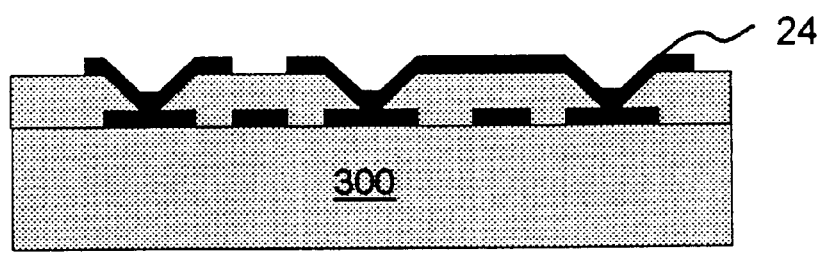

FIGS. 3a–3e illustrate a variant of the first exemplary manufacturing method of a semi-finished printed circuit board component in accordance with FIGS. 2a–2f. In the case of this further manufacturing method for a semi-finished printed circuit board 300, in contrast to FIGS. 2a–2f, a prefabricated product 200 without an external conductive material surface is utilized (FIG. 3a). In accordance with FIGS. 3b and 3c, for example, blind or pocket holes are embossed into the dielectric material 20 with the embossing die 100 and subsequently cleaned. In accordance with FIG. 3d and FIG. 3e, the whole exposed surface of the prefabricated product is coated with electrically conductive material such as, for example, copper 22 by means of known processes, contacted through and photo-chemically structured. The prefabricated product, in particular, can be coated with electrically conductive material by means of processes involving no electric current (chemical) or electro-plating processes (electro-chemical).

Figure 4A:
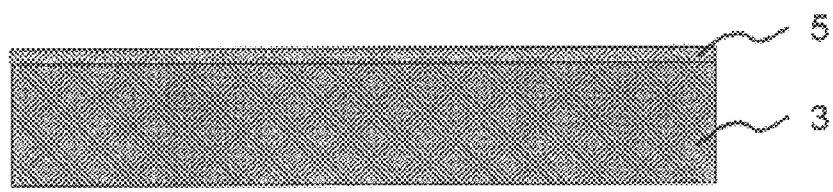
Figure 4B:
Figure 4C:
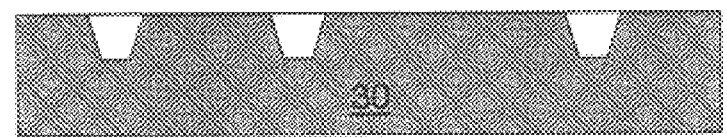
Figure 4D:
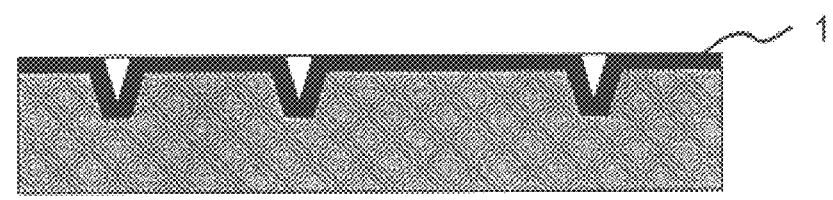
Figure 4E:
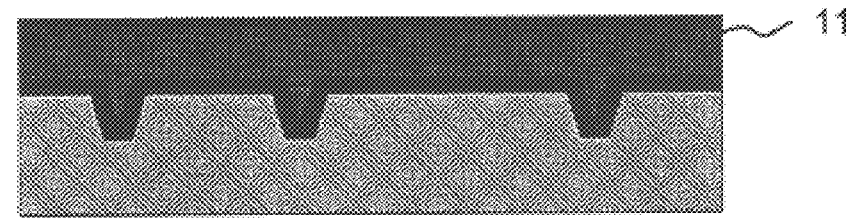
Figure 4F:
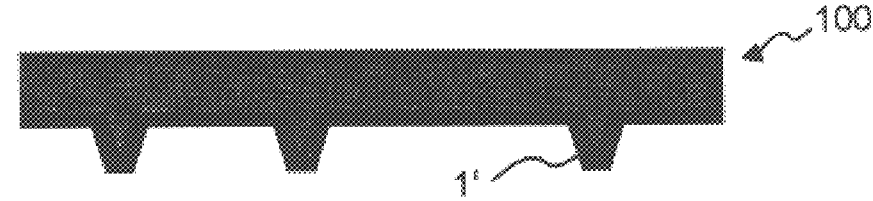

As shown in the further exemplary manufacturing method in accordance with FIGS. 4a–4f, the embossing die can be manufactured with other known processes such as, for example, electro-forming. In doing so, in accordance with the FIGS. 4a to 4c from a source material 3 first a negative original mould 30 is manufactured by means of photo-chemical or mechanical processing (for example, by means of photosensitive resist 5, which is exposed to hardened photosensitive resist 50), which thereupon by means of an electroplating process is coated with, e.g., a layer of metal 1 (FIG. 4d). Depending on the thickness and stability of this electroplated metal layer, it can be additionally stiffened by the adding of a supporting plate 11 (FIG. 4e). This, however, is not a condition. In preference, but not necessarily, the electroplated layer of metal is a chromium layer, which has a poor adhesion on the original mould. This makes removal of the embossing tool 100 from the original mould more easy (FIG. 4f). With knowledge of the invention presented here, it is contemplated that one skilled in the art can make numerous variations of the manufacturing process with electro-forming of a further embossing die at his disposal. On principle, with knowledge of the invention presented here, all cost-effective embossing processes can be utilized.

Figure 5A:
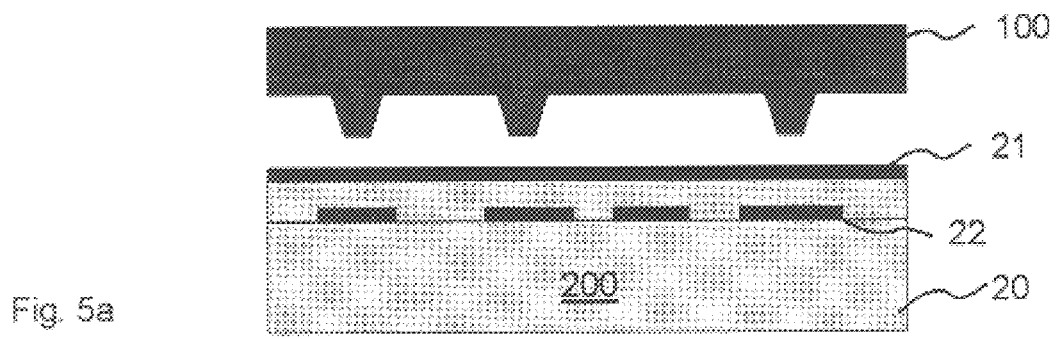
Figure 5B:

By means of this further manufacturing process, embossing dies 100 or die plates with more pointed bumps 1' can be manufactured. A die plate of this type can be utilized to punch through the copper 21 of the outer layer of a prefabricated product 200 without etching it off beforehand, as a result of which a photo-chemical process step can be eliminated (FIG. 5a). In doing so, the relatively soft copper is pressed into the micro-holes and forms an already electrically conductive sidewall of the micro-holes (FIG. 5b).

Figure 5C:
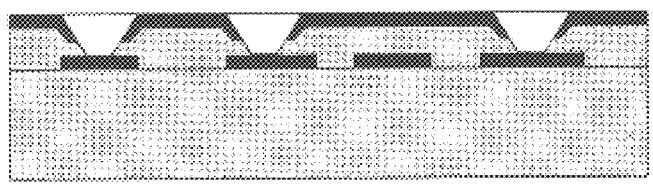
Figure 5D:
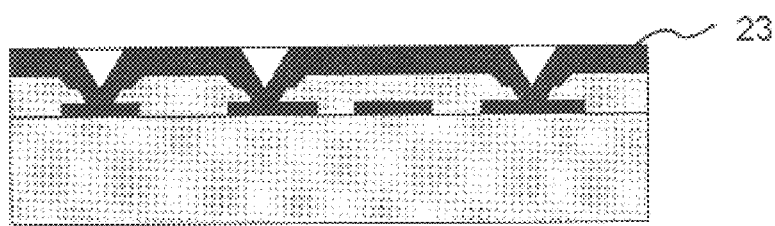
Figure 5E:
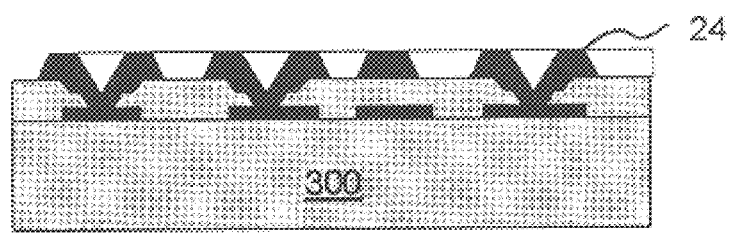

Also in the case of this variant of the method, a subsequent cleaning, for example, by means of plasma or wet-chemical processes (FIG. 5c) is necessary. Thereupon, analogous to the process shown in FIGS. 2a–2f, the surface is coated with copper 23 by means of known processes and reinforced by electroplating, as a result of which also the micro-holes become electrically conductive (FIG. 5d). By means of a photo-chemical structuring process, a conductive pattern 24 is etched into the copper. The semi-finished printed circuit board 300 is ready.

Figure 6A:
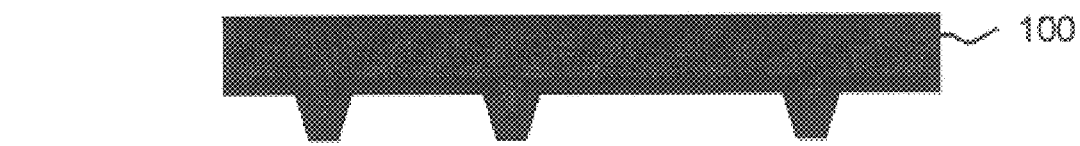
Figure 6B:
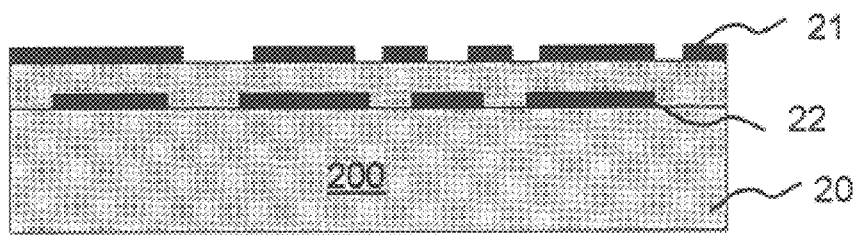
Figure 6C:
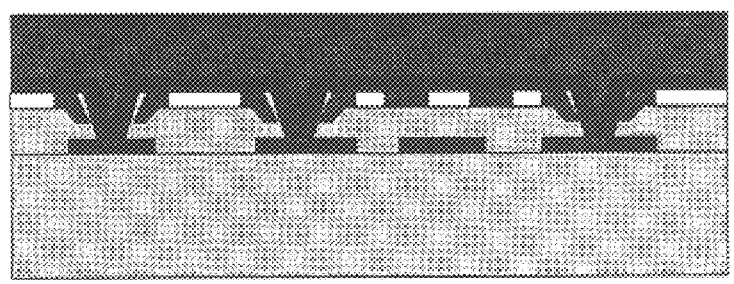
Figure 6D:
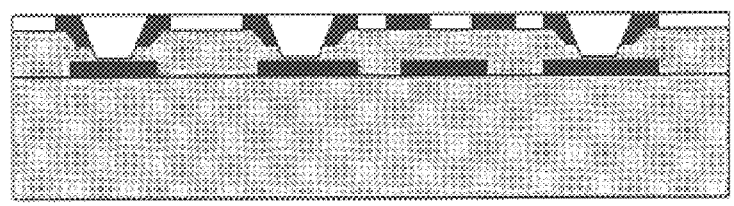
Figure 6E:
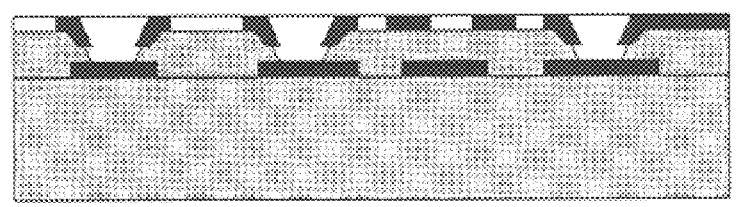

In a variation of the method shown in FIGS. 5a–5e, one can substitute an electro-plating through contacting process by the application of an electrically conductive adhesive 25 into the holes of the semi-finished printed circuit board 300 (FIG. 6e), which appears appropriate in particular in the case of highly cost-sensitive printed circuit boards or boards in the field of consumer electronics. The application can be implemented by means of a screen printing process, with a dispenser, bubble-jet process, etc.

These embossing processes make it possible to significantly reduce the processing time (for example, by a factor of 5). When utilizing plasma for the subsequent cleaning, because of the short plasma reaction time in comparison with plasma drilling no disadvantageous undercutting takes place, which increases the production yield. The production yield is furthermore increased, because only those holes that are defined by the embossing die plate are actually produced.

FIG. 7 schematically illustrates an exemplary embossing device 100, produced with an advantageous manufacturing process. The embossing dies described up to now to a great extent concern embossing die plates. For implementing the invention, however, it is also possible to utilize embossing devices such as electronically controlled die plates, in analogy to matrix printers. Such an embossing device is depicted in an exemplary fashion in the FIGS. 7 to 9i. FIG. 7 shows a part of an advantageous embossing device 100 in the form of a needle-shaped bump 101 for a matrix printer. This needle-shaped bump, for example, in the zone of the tip is sharpened in a cone-shaped, conical or pyramidal manner, wherein the angle at the tip is smaller than 90°. Particularly advantageous, but not imperative is the fact, that the needle in the zone of the tip has a shoulder and a cone-shaped bump, which shoulder automatically limits the depth of penetration during the embossing process. The needles advantageously are made out of a hard and wear-resistant material.

Figure 8A:
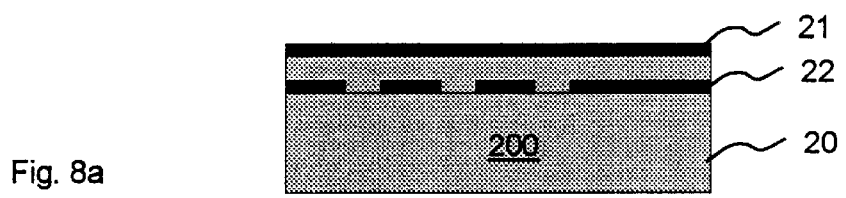
Figure 8B:
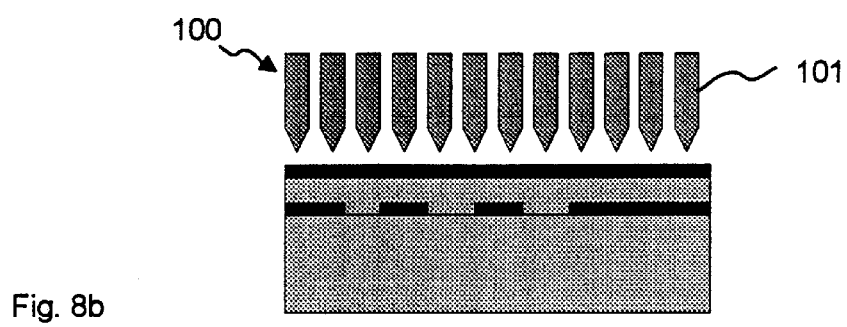
Figure 8C:
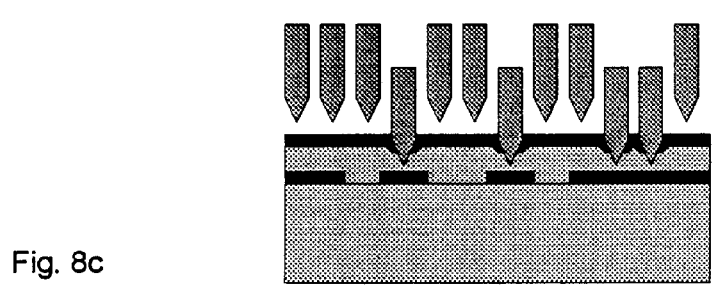
Figure 8D:
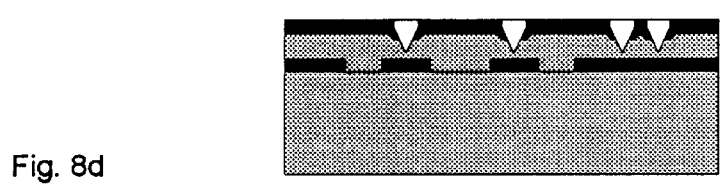
Figure 8E:
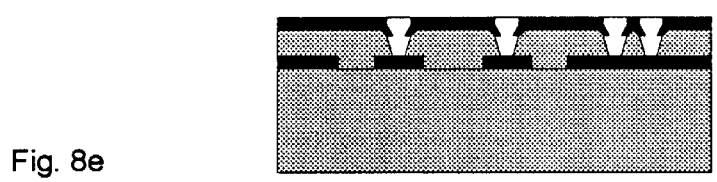
Figure 8F:
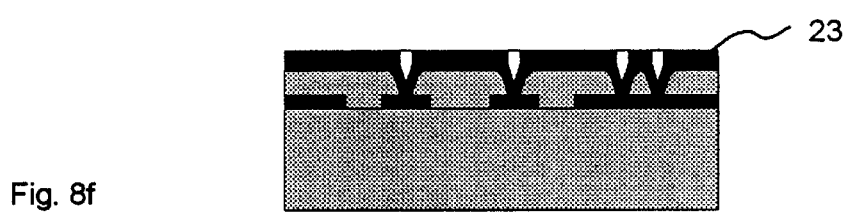
Figure 8G:
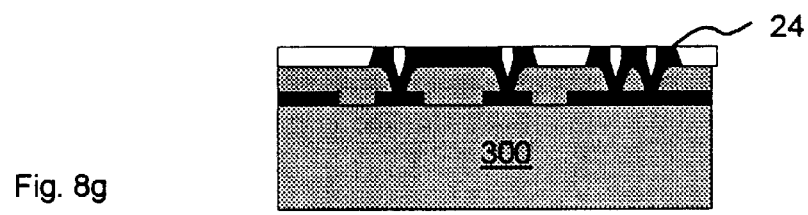

FIGS. 8a–8g illustrate a further exemplary manufacturing method for semi-finished printed circuit boards using an embossing device in accordance with FIG. 7. In the case of this further manufacturing method, a matrix embossing device 100 with a multitude of needle shaped bumps 101 is positioned opposite a prefabricated part 200 for semi-finished printed circuit board components (FIGS. 8a and 8b). Each individual one of the needle-shaped bumps is electronically controllable, for example, by means of a computer. The needles are advantageously arranged in a certain grid pattern, for example, about 0.3 mm. In order to reach all points on the surface of the prefabricated component, for example, the prefabricated component is moved in X- and Y-direction relative to the needle-matrix embossing device. In doing so, either the prefabricated component and/or the matrix embossing device can be moved. In accordance with FIGS. 8c and 8d, for example, blind or pocket holes are embossed in the dielectric material 20. To achieve this, needles are electronically activated, so that they punch small cone-shaped indentations into the surface of the prefabricated component. The needles 101 at their tip are advantageously shaped such that they puncture the dielectric material coated with conductive material 21 (such as, for example, copper), and cone-shaped indentations are produced. The striking force advantageously is controllable such that the depth of these micro-holes amounts to around 80% of the spacing between two layers of electrically conductive material to be connected, for example, by blind or pocket holes. Since the cone-shaped indentations do not extend to the next level of electrically conductive material 22, the remaining part of the, for example, organic dielectric material is deepened by a further removing or displacing process. This is implemented, for example, in the subsequent cleaning step with plasma or by means of a wet-chemical process, whereby, for example, slight undercuts are produced (FIG. 8e). As a result of this, the next layer of electrically conductive material at the bottom of the blind or pocket holes is uncovered. In accordance with FIG. 8f and FIG. 8g, the whole exposed surface of the prefabricated component by means of known processes is coated with electrically conductive material 23, such as, for example, copper, contacted through and photo-chemically structured into conductive tracks 24. The semi-finished printed circuit board 300 is ready.

FIGS. 9a–9i shows a variant of the further exemplary manufacturing method of a semi-finished printed circuit board component in accordance with FIGS. 8a–8g. In the case of this further manufacturing method, and in contrast to that shown in FIGS. 8a–8g, a prefabricated component 200 without any electrically conductive material in the outer surface is utilized (FIG. 9a). The matrix embossing device 100 therefore does not have to penetrate a layer of copper, for example (FIG. 9b). In accordance with FIGS. 9c and 9d, for example, blind or pocket holes are embossed into the dielectric material. Thereupon such blind or pocket holes are deepened and cleaned by means of plasma—or wet-chemical processes. In accordance with FIGS. 9e to 9g, for example, removable masks 7 made of, e.g., metal, are utilized. The removable masks are placed on the to be cleaned and/or to be deepened surface of the prefabricated part and which have recesses at the to be deepened and/or cleaned micro-holes. Through these recesses in the masks, the surfaces of the prefabricated parts are only deepened and/or cleaned in the zone of the micro-holes, for example, by means of plasma reaction. The next layer of electrically conductive material at the bottom of the blind or pocket holes is therefore exposed. In accordance with FIGS. 9h and 9i, the whole exposed surface of the prefabricated component is coated with electrically conductive material 23, such as, for example, copper by means of known processes, contacted through and photo-chemically structured into conductor track patterns 24. The semi-finished printed circuit board 300 is complete.

The advantages of using an embossing device in comparison with an embossing die plate are based on the fact:

that no embossing die plates are required and, therefore, also do not have to be manufactured, the method with the utilization of an embossing device is therefore more flexible and adaptable, this in particular in the case of changes, for example, to the circuit design, that the needle tips can be optimally shaped, while an embossing die plate produced by etching only permits one defined form, and that the manufacturing process can be carried out in single pass, i.e., in a continuous process, in analogy to the printing of a sheet of paper.

The disadvantages of the use of an embossing device in comparison with that of an embossing die are the longer processing times. This signifies, that for smaller batches of semi-finished printed circuit board components and printed circuit boards the utilization of an embossing device, such as, for example, the described matrix embossing device, is economically advantageous, while for large batches of semi-finished printed circuit board components and printed circuit boards the use of embossing dies, such as, for example, the described embossing plates is economically more beneficial.

FIGS. 10a–11c schematically illustrate parts of further exemplary semi-finished printed circuit board components, manufactured with the use of an embossing die or an embossing device. The description of the manufacturing method of a semi-finished printed circuit board component in accordance with the FIGS. 10a–11c is similar to the previously described manufacturing methods, so that reference is made to these descriptions and in the following description in particular differences of the manufacturing methods in accordance with the FIGS. 10a–11c in comparison with the previously described manufacturing methods are emphasized.

An embossing die 100 or an embossing device 100 according to FIG. 10a is positioned opposite a prefabricated component 200 for semi-finished printed circuit boards and in an embossing process is pressed against the prefabricated component, as a result of which the points 1' are pushed into the prefabricated component and locally displace electrically conductive material 21, such as, e.g., copper on the outside, as well as dielectric resin 20 (FIG. 10a). Through the embossing or piercing, very small, so-called micro-holes are produced. Correspondingly, the contact surface to the next deeper-lying electrically conductive material 22 is very small. These indentations serve, for example, for the manufacturing of through contacting blind or pocket holes.

At the bottom of the embossed micro-holes, the resin is not completely displaced by the embossing alone, which makes a thorough cleaning of these micro-holes necessary. This can be implemented by means of plasma or also wet-chemical processes. In doing so, the indentations are enlarged down to the next internal electrically conductive layer of material of, e.g., copper, so that contact surfaces for blind or pocket holes to be manufactured are exposed (FIG. 10b).

In accordance with FIG. 10c, subsequently the produced semi-finished printed circuit board can be coated with electrically conductive material 24, such as, e.g., copper by means of known processes and contacted through. A photo-chemical structuring of the conductor tracks, etc., and a further processing to a semi-finished printed circuit board 300 is therefore possible, as already described and demonstrated above.

In order to ensure with certainty a piercing of thin layers of electrically conductive material, the bumps of the embossing die/embossing device have to be designed to be rather sharply pointed. This again leads to very small micro-holes. The diameters of the bottoms of the holes of these micro-holes can, as already previously described, be enlarged by plasma reaction or by wet-chemical processes, so that internal electrically conductive material is exposed as contact surfaces, for example, for blind or pocket holes to be produced. Such an enlargement in accordance with FIG. 11a, however, is also possible by means of a rotational vibration of the embossing die 100 or embossing device 100. A rotational vibration of this kind is indicated by the closed circular arrow in FIG. 11a. Vibrations can be imposed upon the embossing die and/or embossing device by means of known methods. These vibrations of the tips preferably take place in a circular direction and have the effect that the tips inserted into the dielectric material 20 of the prefabricated part 200 enlarge the indentations in a circular shape and deepen them (FIG. 11b). The hole sizes can therefore be determined by the amplitude size of the vibrations. A subsequent cleaning by means of plasma or wet-chemical processes is possible but not imperative. In accordance with FIG. 11c, subsequently the produced semi-finished printed circuit board component by means of known processes is coated with electrically conductive material 23, such as, e.g., copper and through contacted. A photochemical structuring of conductor tracks, etc., is therefore possible, as already described above.

Advantageous in such a mechanical hole enlargement or deepening is the fact that subsequent cleaning processes are drastically shortened, which has positive effects on the economy of the production process. Advantageous in such a mechanical hole enlargement is, furthermore, that the contact surface at the bottom of the blind or pocket holes is enlarged, which increases the reliability of the Z-axis connection.

Other movements and directions of the vibrating tips are absolutely possible with the knowledge of the invention herein presented, one skilled in the art in this respect has many variations at his disposal. Thus it is possible, for example, in the production of through holes, wherein embossing dies or embossing devices are pressed onto a prefabricated part on both sides, to have the tips of embossing dies or embossing devices applied onto different sides of the prefabricated part rotating in opposite directions.

Figure 12A:
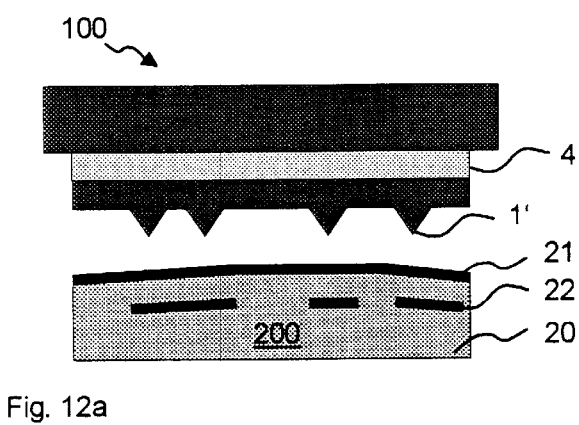
Figure 12B:
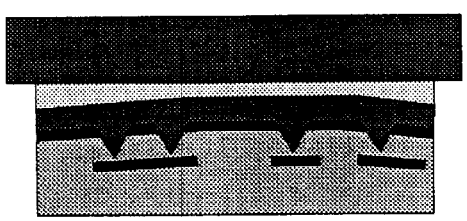

FIGS. 12a–12b schematically illustrate a part of a further exemplary semi-finished printed circuit board component, manufactured with the use of an embossing die or an embossing device as well as with the use of an elastic intermediate layer. The description of the manufacturing method of a semi-finished printed circuit board component in accordance with FIGS. 12a–12b is similar to the manufacturing methods previously described, so that reference is made to these descriptions and in the following description in particular differences of the manufacturing methods in accordance with FIGS. 12a–12b as compared with the previously described manufacturing methods are emphasized.

In accordance with 12a, an embossing die 100 or an embossing device 100 with an elastic intermediate layer 4 is positioned opposite a prefabricated component for semi-finished printed circuit boards and, in an embossing process, is pressed against the prefabricated component, as a result of which the tips 1' push into the prefabricated component and locally displace electrically conductive material 21, such as, e.g., copper located on the outside as well as dielectric resin 20 (FIG. 12b). The elastic intermediate layer of the embossing die or embossing device makes possible an adaptation to possible variations in the thickness of the semi-finished components, which can have a negative effect during embossing. FIG. 12a shows a prefabricated component of this kind with differing thickness. The application of an elastic intermediate layer advantageously takes place between the embossing die/embossing device and the actual pressure plate. The elastic intermediate layer, when pressed against the prefabricated component, adapts to its unevenness and with this enables an embossing with a uniform embossing depth. Thereupon cleaning by means of plasma or wet-chemical processes takes place. Subsequently, the semi-finished printed circuit board can be coated with electrically conductive material, such as, e.g., copper, by means of known processes and contacted through. Also a photo-chemical structuring of the conductor tracks, etc., as described and demonstrated above, is possible.

Figure 14A:
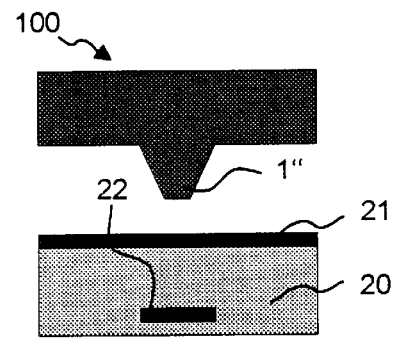
Figure 14B:
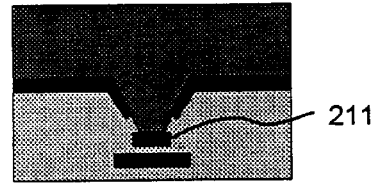
Figure 14C:
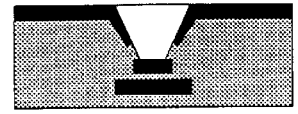

FIGS. 14a–14c schematically illustrate a part of a semi-finished printed circuit board component with stamped errors, manufactured with the use of a disadvantageous embossing die in accordance with FIG. 13b. The description of the manufacturing method of a semi-finished printed circuit board in accordance with FIGS. 14a–14c is similar to the previously described manufacturing methods, so that reference is made to these descriptions and in the following description in particular differences of the manufacturing methods in accordance with FIGS. 14a–14c in comparison with the previously described manufacturing methods are emphasized.

The shape of the tip of an embossing die/embossing device is very important. This is because, like, for example the flattened tip 1" illustrated in FIG. 13b leads to a disadvantageous type of embossing process. A disadvantageous embossing process of this kind is illustrated in an exemplary manner in FIGS. 14a–14c. In accordance with FIG. 14a an embossing die or an embossing device 100 with flattened tips 1" is positioned opposite a prefabricated component 200 for semi-finished printed circuit boards and in an embossing process is pressed against the prefabricated component, as a result of which the tips are pushed into the prefabricated component and locally displace externally applied electrically conductive material 21, such as, e.g., copper, as well as dielectric resin 20 (FIGS. 14a and 14b). Through the embossing, indentations or micro-holes for the production of, for example, blind or pocket holes to be contacted through are produced. By the flattened tips, during embossing small round plates of copper 211 are punched out of the externally applied electrically conductive layer and pushed inwards against the next layer of electrically conductive material 22 (FIG. 14c). In doing so, between the small round copper plate and the layer of electrically conductive material, a thin layer of dielectric material is present. During a subsequent cleaning of the indentations by means of plasma or wet-chemical processes, the dielectric material covered by the small round copper plate cannot be removed anymore. A production of blind or pocket holes is therefore prevented.

Punching defects of this kind are avoided with the utilization of embossing dies/embossing devices with points with sharp tips. FIG. 13a and FIGS. 15a–15m schematically illustrate parts of further exemplary embossing dies, manufactured using further advantageous manufacturing methods.

FIG. 13a shows a tip 1', which compared to the disadvantageously flattened tip according to FIG. 13b, has been rounded in an electro-chemical polishing process. To achieve this, advantageously the embossing die plate with flattened tips 1" in accordance with FIG. 13b is connected as anode, so that edges and micro-tips in an etching process are more rapidly removed than flat zones. The result is the sharp tip 1' in accordance with FIG. 13a. With the knowledge of the invention presented here, the specialist has many and diverse possibilities of variation at his disposal. Thus it is absolutely possible to round off flattened tips with a sandblasting process. It is also possible to round off flattened tips using a wet-chemical etching process.

FIGS. 15a–15m illustrate a further manufacturing method for exemplary embossing dies with points with sharp tips. The source material in accordance with FIG. 15a is a film or a sheet metal plate made of, for example, metal 1. In a first photo-chemical structuring in accordance with FIG. 15b, a thin layer of photosensitive resist 5 is applied to the source material surface and exposed through a film pattern (FIG. 15c). At all exposed surface zones, the photosensitive resist is hardened (FIG. 15d). After the development of this layer of photosensitive resist, as shown in FIG. 15e, only hardened photosensitive resist 50 remains stuck to the surface of the source material. This photosensitive resist advantageously forms circular or also polygonal island zones having a diameter of between about 25–100 $\mu$m.

Subsequently, this surface of the source material is etched with a suitable etching substance (FIG. 15f). With the utilization of an etching depth of 10–50 $\mu$m, in the zone of the resist islands, small bumps 1* having a diameter of between about 10–50 $\mu$m are produced. The photosensitive resist is thereupon stripped (FIG. 15g).

In a further photo-chemical structuring in accordance with FIG. 15h, a further layer of photosensitive resist 6 is applied to the surface of the source material equipped with small bumps and exposed through a film pattern (FIG. 15*i*). At all exposed surface zones the further photosensitive resist is hardened (FIG. 15*j*). After the development of this layer of photosensitive resist, as shown in FIG. 15*k*, only hardened photosensitive resist 60 remains stuck to the surface of the source material. This photosensitive resist advantageously forms circular and also polygonal island zones having a diameter of between about 100–300 µm.

Now this surface of the source material is etched once again with a suitable etching substance (FIG. 15*l*). With utilization of an etching depth of 100–300 µm, in the zones of the resist islands small bumps 1' having a diameter of between about 100–300 µm are produced. The photosensitive resist is thereupon stripped (FIG. 15*m*). The embossing die 100 is finished.

What is claimed is:

1. Method for the production of micro-holes in semi-finished components for printed circuit boards, which semi-finished components consist of several layers of electrically conductive materials and one or more layers of a dielectric material, comprising the steps of:
   providing a prefabricated component having an at least partially covering external electrically conductive layer,
   pushing an embossing die or embossing device against the prefabricated component on the side of the outermost electrically conductive layer, thereby creating holes in the dielectric material, and
   cleaning the holes by means of plasma or by means of wet-chemical processes.

2. Method in accordance with claim 1, wherein the electrically conductive layer has pre-structured openings and tips of the embossing die are positioned in such that, with respect to position, they coincide with pre-structured openings.

3. Method in accordance with claim 1, wherein electrically conductive materials of said outermost layer are pressed into dielectric materials by said embossing die or embossing device.

4. Method in accordance with claim 1, including applying, by means of electroplating, conductive material corresponding to the material of the outermost layer following the embossing of the holes.

5. Method in accordance with claim 1, wherein the holes are deepened, enlarged and cleaned by means of plasma or by means of wet-chemical processes.

6. Method in accordance with claim 1, including placing masks with recesses onto surfaces of the prefabricated components in the zone of the micro-holes and cleaning or deepening by means of plasma or wet-chemically the surfaces of the prefabricated components through these recesses in the masks only in the zone of the holes.

7. Method in accordance with claim 1, said perforation tool or perforation die comprising cone-shaped bumps as perforation tips.

8. Method in accordance with claim 7, wherein said embossing dies or embossing tool with cone-shaped perforation tips is pressed against prefabricated components and is put into rotating vibration, as a result of which said cone-shaped bumps are pushed into electrically conductive materials and/or dielectric materials and the holes produced by this are enlarged through vibration.

9. Method in accordance with claim 7, wherein vibrations are imposed upon said embossing die or embossing tool that enlarge and deepen the embossed holes in a circular form and wherein the hole sizes are determined through the amplitude size of the vibrations.

10. Method in accordance with claim 7, wherein said embossing die or embossing device, due to the cone-shaping of said bumps, is easily removable from said prefabricated components.

11. Method in accordance with claim 1, wherein said embossing tool or embossing device, through an elastic intermediate layer located between said embossing die or embossing device and a pressure plate, is pressed into uneven prefabricated components with uniform embossing depths.

12. An embossing device for producing holes in a semi-finished prefabricated component for printed circuit boards, wherein bumps are present at all points of a surface of the embossing device that correspond to points in the prefabricated component in which holes are to be produced, and wherein the embossing device is an embossing die or matrix printer having a multitude of cone-shaped bumps, said cone-shaped bumps being formed as needles that are individually and electronically controllable through a computer.

13. Embossing device in accordance with claim 12, wherein said needles are arranged in a grid pattern and said prefabricated component and said matrix printer are movable relative to one another.

14. Embossing device in accordance with claim 12, wherein electronically activated needles punch small cone-shaped indentations into the surface of said prefabricated component and that the striking force of the needles is controllable, so that the depth of the micro-holes amounts to around 80% of the spacing between the layers of electrically conductive material to be connected together.

* * * * *